United States Patent
Liang et al.

[11] Patent Number: 5,924,007
[45] Date of Patent: Jul. 13, 1999

[54] METHOD FOR IMPROVING THE PLANARIZATION OF INTER-POLY DIELECTRIC

[75] Inventors: Chia-Wen Liang, Hsinchu Hsien; Jason Jenq, Pingtung; Chuan-Fu Wang, Taipei Hsien; Sun-Chieh Chien, Hsinchu, all of Taiwan

[73] Assignee: United Microelectronics Corp., Taiwan

[21] Appl. No.: 08/910,999

[22] Filed: Aug. 14, 1997

[30] Foreign Application Priority Data

Jun. 24, 1997 [TW] Taiwan ................. 86108791

[51] Int. Cl.$^6$ .................................. H01L 21/469
[52] U.S. Cl. ...................... 438/626; 438/663; 438/632
[58] Field of Search ................ 438/626, 663, 438/631, 632

[56] References Cited

U.S. PATENT DOCUMENTS 5,409,858  4/1995  Thakur et al. .
5,474,955  12/1995  Thakur .
5,646,075  7/1997  Thakur et al. .

*Primary Examiner*—Caridad Everhart
*Attorney, Agent, or Firm*—Rabin & Champagne, P.C

[57] ABSTRACT

A method of improving the planarization of inter-poly dielectric layers. On a semiconductor device on which a poly-silicon layer is formed, by using atmosphere chemical vapor deposition, an undoped inter-poly dielectric layer is formed. A doped inter-poly dielectric layer is formed on the undoped inter-poly dielectric layer. Under a high temperature, reflow and etching back operations are performed for the doped inter-poly dielectric layer. Before a second poly-silicon layer is formed, a rapid thermal process is performed.

6 Claims, 1 Drawing Sheet

METHOD FOR IMPROVING THE PLANARIZATION OF INTER-POLY DIELECTRIC

BACKGROUND OF THE INVENTION

1. Field of the Invention

The invention relates to a method of improving the planarization of inter-poly dielectric (IPD) layers, and more particularly to a method of using a rapid thermal process (RTP) to improve the planarization of inter-poly dielectric layers.

2. Description of the Related Art

It is known to use, in very large semiconductor integration (VLSI) circuits, methods which utilize borophosphosilicate glass (BPSG), spin-on-glass (SOG), and etching back techniques to achieve the surface planarization of inter-poly dielectric layers in semiconductor devices.

In a conventional process for fabricating semiconductor devices, on a doped poly-silicon substrate, an undoped inter-poly dielectric layer is formed. Another doped inter-poly dielectric layer is formed on the undoped inter-poly dielectric layer. Being planarized by the above mentioned methods of planarization, a doped poly-silicon layer is formed on the inter-poly dielectric layers. However, it is found that many particles protrude from the interface between the doped inter-poly dielectric layer and the doped poly-silicon. These particles cause an unevenness of the surface, and thus cause serious integration problems, such as the photoresist defocus in the subsequent photolithography process and furnace contamination.

SUMMARY OF THE INVENTION

It is therefore an object of the invention to provide a method of reducing the problems which occur during the process of planarization. After the etching back operation, by using a rapid thermal process, that is, the boron ions and the phosphorus ions in the doped inter-poly dielectric layer, a borophosphosilicate glass is normalized. Therefore, the particle bumps or protrusions at the interface between the BPSG layer and a doped poly-silicon layer are prevented.

According to the invention, a method is provided to improve the planarization of the inter-poly dielectric layer. The method comprises that a poly-silicon layer is formed on a semiconductor device. A first and a second inter-poly dielectric layer are formed on the poly-silicon layer in sequence. A reflow step and an etching back step are performed for the second inter-poly dielectric layer. After the rapid thermal process, a doped poly-silicon layer is formed.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate one embodiment of the invention and together with the description, serve to explain the principles of the invention. In the drawings.

DESCRIPTION OF THE PREFERRED EMBODIMENT

Figure 1A:
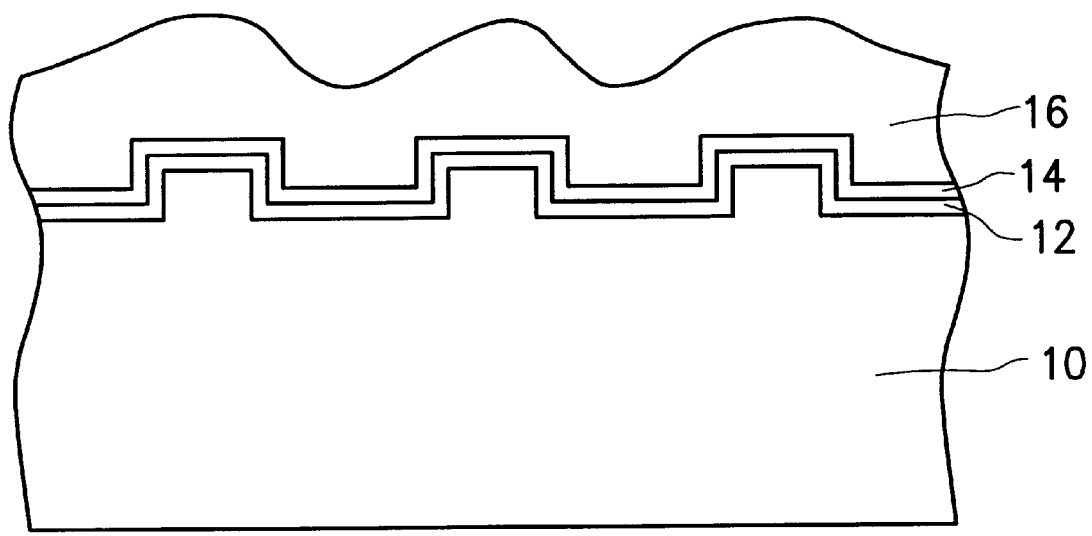
FIGS. 1A and 1B show the operations used to improve the planarization of the inter-poly dielectric layers, according to the invention.

Referring to FIG. 1A, the operation performed for improving the planarization of an inter-poly dielectric layer using a rapid thermal process is shown. On the surface of a semiconductor 10 on which a poly-silicon layer 12 is formed, an undoped inter-poly dielectric layer 14, such as a silicon oxide layer, is formed with a thickness of about 1500 Å. The layer 14 is formed using chemical vapor deposition (CVD), such as atmosphere chemical vapor deposition (APCVD). On the inter-poly dielectric layer 14, a doped inter-poly dielectric layer 16 is formed with a thickness of about 1500 Å. Layer 16 can be, for example, a borophosphosilicate glass layer. With the formation of the undoped inter-poly dielectric layer 14 between the poly-silicon layer 12 and the doped inter-poly dielectric layer 16, the diffusion of ions from layer 16 to poly-silicon layer 12, which affects the quality of the semiconductor device 10, can be prevented.

Figure 1B:
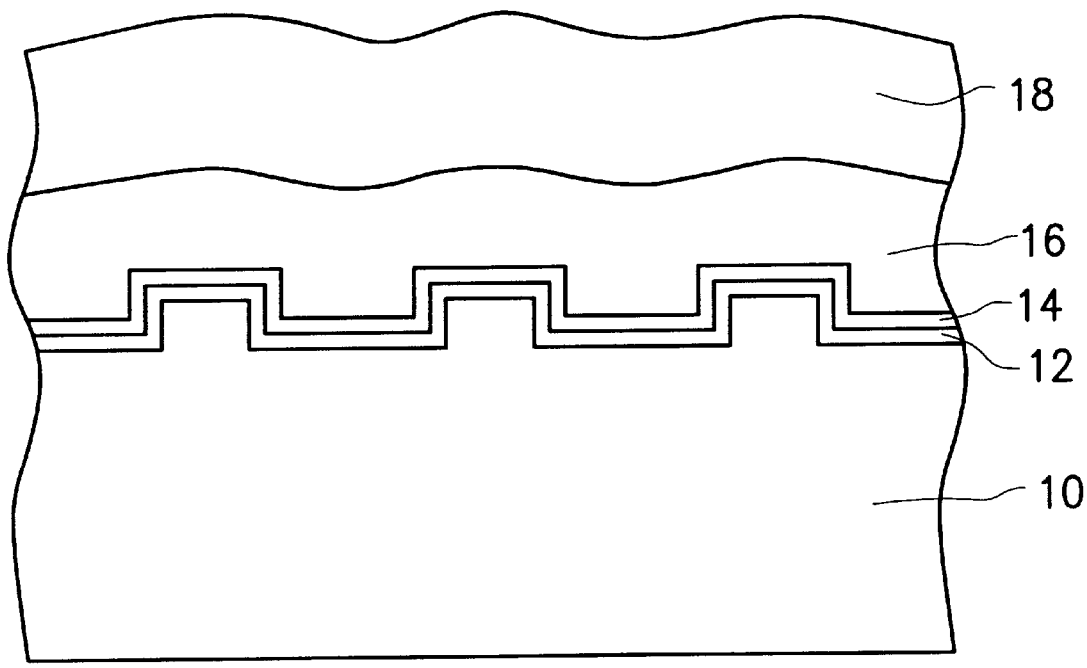

In FIG. 1B, a reflow step is performed at a high temperature. An etching back step is then performed for the borophosphosilicate glass layer 16. A rapid thermal process is next performed. The rapid thermal process is performed under a nitrogen or argon environment, at temperature between about 800° C. and about 900° C. for about 30 seconds. A second poly-silicon layer 18 is then formed on the layer 16.

The main objects of the above mentioned reflow and etching back operations are to planarize the borophosphosilicate glass layer 16. However, these two operations cause many problems, such as particle bumps or protrusions from the interface of layer 16 and the second doped poly-silicon layer 18, and thus cause the photoresist defocus in the subsequent photolithography process. In addition, these particles can contaminate the furnace. Therefore, before the second poly-silicon layer 18 is formed, a rapid thermal process is performed to normalize the boron ions and phosphorus ions in borophosphosilicate glass layer 16, thus preventing the above mentioned problems.

Other embodiments of the invention will apparent to those skilled in the art from consideration of the specification and practice of the invention disclosed herein. It is intended that the specification and examples to be considered as exemplary only, with a true scope and spirit of the invention being indicated by the following claims.

What is claimed is:

1. A method of improving a planarization of an inter-poly dielectric layer, comprising:
   providing a semiconductor device, on which a first poly-silicon layer is formed;
   forming a first undoped inter-poly dielectric layer to a thickness of about 1500 Å on the first poly-silicon layer;
   forming a second inter-poly dielectric layer on the first undoped inter-poly dielectric layer;
   performing a reflow operation for the second inter-poly dielectric layer;
   etching back the second inter-poly dielectric layer;
   performing a rapid thermal process; and
   forming a second poly-silicon layer over the second inter-poly dielectric layer.

2. The method according to claim 1, wherein said forming a second inter-poly dielectric layer comprises forming a borophosphosilicate glass inter-poly dielectric layer to a thickness of about 1500 Å.

3. The method according to claim 1, wherein said performing a rapid thermal process includes performing the rapid thermal process in a nitrogen environment, at a temperature at about 800° C. to 900° C.; and for a period of about 30 seconds.

4. The method according to claim 1, wherein said performing a rapid thermal process includes performing the rapid thermal process in an argon environment, at a temperature at about 800° C. to 900° C.; and for a period of about 30 seconds.

5. A method of improving a planarization of an inter-poly dielectric layer, comprising:

planarizing an inter-poly dielectric layer using a reflow and an etching back procedure;

performing a rapid thermal process; and forming a poly-silicon layer over the inter-poly dielectric layer, wherein said planarizing, performing and forming operations are performed in the sequence given.

6. The method according to claim 1, wherein said first inter-poly dielectric layer comprises silicon oxide.

* * * * *